(12) United States Patent
Koh

(10) Patent No.: US 6,218,710 B1
(45) Date of Patent: Apr. 17, 2001

(54) METHOD TO ENSURE ISOLATION BETWEEN SOURCE-DRAIN AND GATE ELECTRODE USING SELF ALIGNED SILICIDATION

(75) Inventor: Chao-Ming Koh, Suan-She Village (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 08/724,148

(22) Filed: Oct. 1, 1996

Related U.S. Application Data

(60) Continuation of application No. 08/519,065, filed on Aug. 24, 1995, now abandoned, which is a division of application No. 08/270,765, filed on Jul. 5, 1994, now Pat. No. 5,464,782.

(51) Int. Cl.[7] ............... H01L 29/76; H01L 29/94; H01L 31/062
(52) U.S. Cl. ............... 257/382; 257/383; 257/384
(58) Field of Search .................. 257/382, 383, 257/384, 386, 316, 321, 344

(56) References Cited

U.S. PATENT DOCUMENTS

| | | | |
|---|---|---|---|
| 5,089,432 | 2/1992 | Yoo | 437/40 |
| 5,270,240 | * 12/1993 | Lee | 257/321 |
| 5,270,256 | 12/1993 | Bost et al. | 437/195 |
| 5,381,028 | * 1/1995 | Iwasa | 257/316 |
| 5,411,906 | * 5/1995 | Johnson et al. | 257/344 |

* cited by examiner

*Primary Examiner*—Carl W. Whitehead, Jr.
(74) *Attorney, Agent, or Firm*—George O. Saile; Stephen B. Ackerman

(57) ABSTRACT

A MOSFET device fabricated by a method that reduces, the risk of gate to source and drain bridging, has been developed. The process features fabricating a polysilicon structure, which is wider at the top than at the bottom, with a source and drain region, self-aligned to the narrower, underlying polysilicon layer. Subsequent metallization results in metal coverage, only on the surfaces of the wider polysilicon layer. An anneal cycle then converts only the wider polysilicon feature to a metal silicide, resulting in a polycide gate structure, comprised of a wider, overhanging metal silicide layer, on a narrower, underlying polysilicocn layer.

4 Claims, 4 Drawing Sheets

METHOD TO ENSURE ISOLATION BETWEEN SOURCE-DRAIN AND GATE ELECTRODE USING SELF ALIGNED SILICIDATION

This application is a continuation of Ser. No. 08/519,065 filed Aug. 24, 1995 now abandoned which is a divisional of Ser. No. 08/270,765 filed Jul. 5, 1994 now U.S. Pat. No. 5,464,782.

BACKGROUND OF THE INVENTION (1) Field of the Invention

The present invention relates to a process in which Metal Oxide Silicon Field Effect Transistors (MOSFET), devices are fabricated using specific semiconductor fabrication techniques to improve yield and performance.

(2) Description of Prior Art

Very large scale integration (VLSI) technologies have helped the electronic chip industry reduce cost while still increasing chip and circuit performance. Further improvements in cost and performance strongly depends on the ability of the semiconductor process community to either continue to decrease chip size or use less resistive films.

The advances in lithograhy, such as more advanced cameras, or more sensitive photoresist materials, have allowed important features of semiconductor chips to decrease in size thus improving density as well as performance. The reduction ingate electrode dimensions have resulted in narrower channel lengths of FET devices, thus improving performance. However the narrower polysilicon gates are less condutive than their wider counterparts, thus a decrease in performance can result. One method to overcome the resistive aspect of narrower polysilicon gates is via the use of silicided polysilicon gates.

There are several methods for preparing silicided polysilicon gates. One can deposit, either via chemical vapor deposition, (CVD), or vacuum processes, a silicide such as titaniumn silicide, (TiSi2), on a blanket ploysilicon layer and use standard lithography and RIE processes to define a silicide/polysilicon gate. U.S. Pat. No. 5,089,432, by Yoo, shows this process. The use of this technique does not allow the source and drain regions to benefit from this process, since these regions are defined after the polysilicon gates have been formed. A method that does allow both the polysilicon gate as well as the source and drains to be silicided is a self-aligned process, usually referred to as salicide.

The salicide process is accomplished by depositing a metal, such as titanium, (Ti), on the patterned gate and source-drain. The polysilicon gate had previously been subjected to an insulator/reactive ion etching, (RIE), process to create a insulator sidewall which is needed for this salicide process. When these structure are subjected to an anneal step, TiSi2 will form only on the exposed silicon regions, such as the top of the polysilicon gate and the source-drain areas. Ti will remain unreacted on non silicon regions, such as the the polysilicon insulator sidewall. A selective etch is than used to remove the unreacted Ti, not significantly attacking the TiSi2, and thus arriving at low resistance silicided gates and source-drains, isolated by the polysilicon insulator sidewall.

One yield detractor associated with the self aligned process is bridging between the polysilicon gate and the source-drain. This arises from either Ti not being removed by the selective etchant, or somehow the anneal process created TiSi2 on the sidewall and thus the etchant was ineffective. Thus the semiconductor industry is still investigating process sequences that would reduce or eliminate the bridging phenomena.

SUMMARY OF THE INVENTION

It is an object of the present invention to provide a shallow junction FET device in which the source and drain of this device is formed by diffusion from an overlying doped polysilicon layer.

It is another object of this invention to self align the poly silicon gate to an already fabricated source and drain region.

It is still another object of this invention to created a polysilicon gate shape, wider at the top than the bottom, that will subsequently result in shadowing of metal depositions.

And still a further object of this invention is to form a self aligned silicide, on the polysilicon gate as well as the source and drains, with reduced risk of gate/substrate shorts due to bridging.

In accordance with this present invention, a method is described for fabricating a MOSFET device by forming a field oxide pattern and an anti-punch thru region on a silicon substrate. Depositing a polysilicon layer on the field oxide and the exposed silicon substrate and than depositing a silicon nitride layer over the polysilicon layer. Openings thru the silicon nitride and polysilicon layers are made to the substrate and a threshold adjust ion implant, (I/I), is performed. A spacer oxide is than fabricated on the sidewall of the opening followed by a gate oxidation of the exposed silicon substrate in the opening. A second polysilicon layer is deposited over the silicon nitride layer and the gate oxide. The second polysilicon layer is patterned to overlap the opening in the silicon nitride-first polysilicon layers and thus after complete removal of the silicon nitride layer, the second polysilicon overhangs the first polysilicon layer. Ion implantation is performed to dope the polysilicon gate electrode, (second polysilicon), as well as the the first polysilicon layer which after an anneal result in formation of the source-drain regions in the substrate. Titanium is than deposited on all regions except under the the overhang. After an anneal to form the metal silicide on the regions where Ti interfaced silicon, not insulator, removal of the unreacted Ti is performed in a selective etchant. After an additional anneal to reduce the resistivity of the silicide an insulator is deposited and holes opened to the polysilicon gate and the source-drain regions. Metallization and subsequent patterning is performed to contact the gate polysilicon and the source-drain regions.

BRIEF DESCRIPTION OF THE DRAWINGS

The object and other advantages of this invention are best explained in the preferred embodiment with reference to the attached drawing that include.

DESCRIPTION OF THE PREFERRED EMBODIMENTS

The method for forming the self aligned silicide is now covered in detail. This self aligned polysilicon gate silicide can be used on MOSFET structures that are currently being manufactured in industry, therefore only the specific areas unique to understanding this invention will be described in detail.

Figure 1:
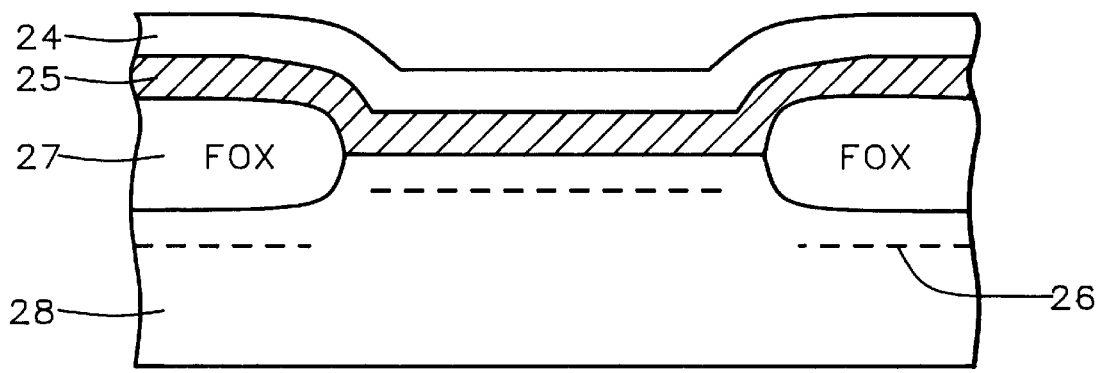
FIG. 1–7 which schematically illustrate the cross-section representation of key fabrication stages. The figures follow the process flow in the preferred embodiment for making the self aligned MOSFET device.

Referring now to FIG. 1, a cross-sectional view of the substrate 28, is shown. The preferred substrate is composed of P type single crystal silicon with a <100>crystallographic orientation. A thick field oxide 27 (FOX), for isolating the device, is first formed surrounding the region where the device is to be built. Briefly, the method commonly practiced in the industry is to use a thin thermal oxide (pad oxide) and a silicon nitride layer as an oxidation mask. The desired field oxide regions are etched open in the oxide/nitride layer using conventional photolithographic techniques. A field oxide is than grown, typically to a thickness of about 4000 to 6000 angstroms.

After removal of the nitride/oxide layer, via use of a heated solution of phosphoric acid, H3PO4, for the nitride, and a buffered or dilute HF solution for the oxide, the silicon surface is carefully cleaned. A field and anti-punch thru I/I is now performed, using B11 at an energy between about 50 to 180 Kev and a dose between 1E12 to 4E12 atoms/cm2. These dopants are shown as region 26 in FIG. 1. Again after cleaning the surface to remove any native oxide, a polysilicon layer 25 is deposited using a low pressure chemical vapor deposition, (LPCVD). The thickness used is usually in the range from 500 to 1000 angstroms. A LPCVD silicon nitride, Si3N4, layer 24 is then deposited onto the polysilicon layer. The thickness of the nitride layer can be 500 to 1000 angstroms.

Figure 2:
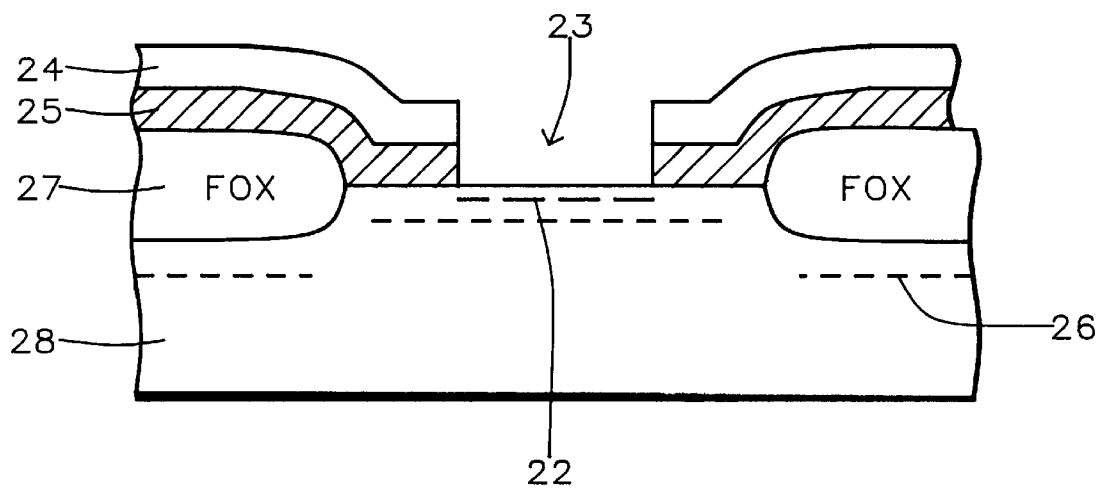

The patterning process for the source and drain (s/d ) is shown in. FIG. 2. Conventional photolithographic techniques, along with RIE processing are used to form image 23. The nitride and polysilicon can be dry etched using RIE reactants such as Cl2+HBr and SF6+O2. Care has to be taken not to remove much single crystal silicon at the completion of the polysilicon portion of the RIE process. Another method used is to define the desired pattern in the nitride using RIE, than remove the defining photoresist. An oxidation is then performed between about 875 to 950° C., to a thickness of about 1150 to 2300 angstroms, to consume all the exposed polysilicon in hole 23. Next a dilute HF is used to remove the reoxidized polysilicon. In both cases the patterned image 23 for the s/d has been formed.

Figure 3:
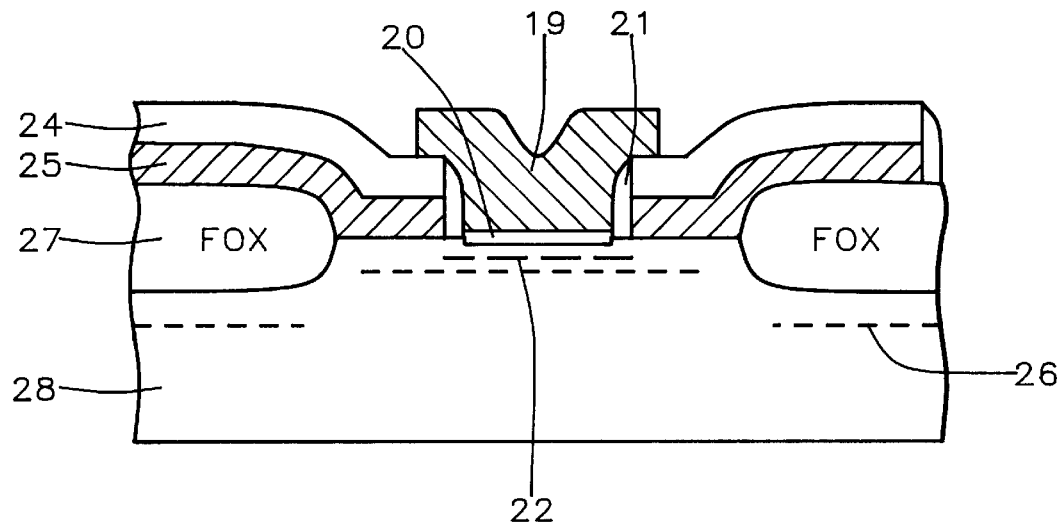

An oxide spacer 21 shown in FIG. 3, is formed along the sides of hole 23, to subsequently isolate the s/d regions from a soon to be formed polysilicon gate. The spacer is formed by LPCVD of SiO2 to a thickness of 1000 to 1500 angstroms. An anisotropic RIE step, using CHF3+Ar, is performed to remove the LPCVD oxide, except on the sides of stripe 23, forming spacer 21. The anisotropic etch also exhibits high selectivity, that is removing SiO2 at a much greater rate than silicon removal.

The composition of layer 21 and layer 24 can be interchanged to have layer 21 be Si3N4, while layer 24 can be SiO2. Of course the etching steps would also be changed accordingly. Again after a carefully cleaned surface a channel I/I is used to obtain a desired threshold voltage. This implant is performed using BF2 at an energy between 30 to 60 Kev and a dose of between 5E11 to 2E12 atoms/cm2, and shown as region 22 in FIG. 3.

After a wet chemical cleaning of the silicon surface a good quality thermal oxide is grown to form the gate oxide 20. The preferred thickness is about 80 to 140 angstroms, grown in a O2 ambient, between 800 to 900° C. Next the gate polysilicon structure is formed by first depositing a polysilicon layer, for example using LPCVD to a thickness of about 1500 to 3000 angstroms.

Conventional photolithographic techniques are than used to define the desired gate pattern in photoresist. The polysilicon gate width is greater than the width of hole 23. An anisotropic RIE step is performed using Cl2+HBr to obtain the polysilicon gate structure 19.

Figure 4:
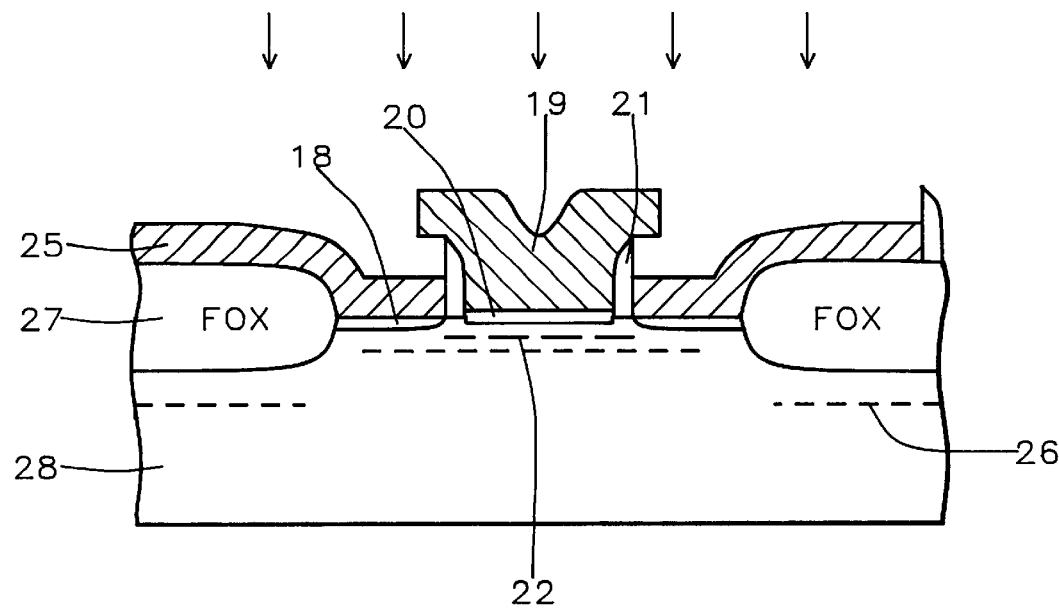

A wet chemical etch is now used to remove Si3N4, layer 24. This is accomplished using H3PO4 at a temperature between 150 to 165° C., (If layer 24 is SiO2 a bufferd HF etchant is used). An I/I is now used to dope both the polysilicon gate, as well as the polysilicon which will be the doping source for the subsequent s/d. This is schematically shown in FIG. 4. The I/I is accomplished using arsenic (As), or phosphorus, (P), at an energy between about 30 to 50 Kev and a dose of 1E15 to 5E15 atoms/cm2. A s/d drive-in, performed in a conventional furnace or a rapid thermal anneal (RTA) tool, at a temperature of about 850 to 900° C., in N2, Ar for 10 to 30 min for conventional furnace, (or 950 to 1000° C., in N2, Ar, for 10 to 30 sec. for the RTA process), results in the outdiffusion of As, or P from polysilicon 25, into the single crystal silicon, forming s/d regions 18.

Figure 5:
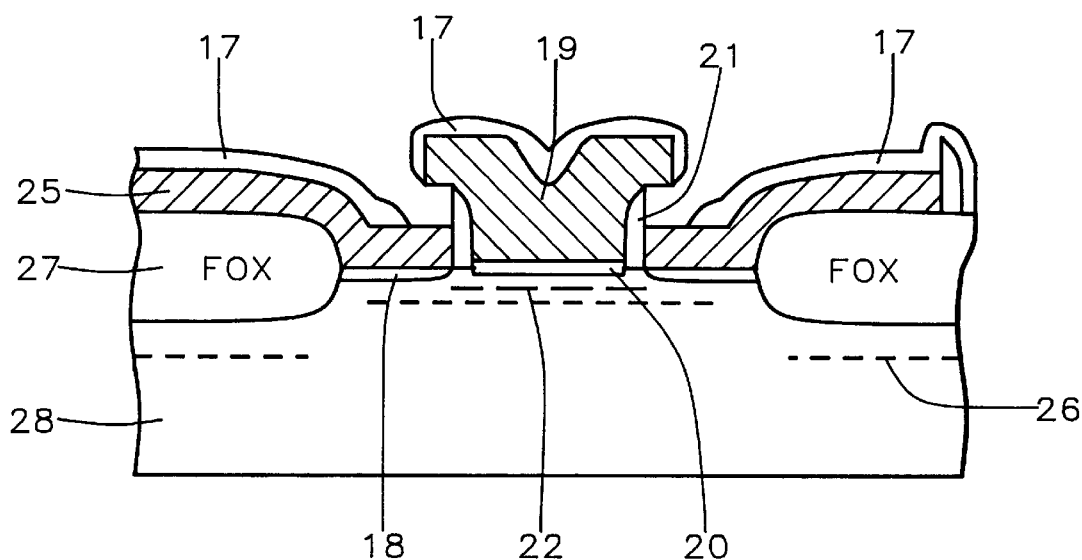

After cleaning the structure, a silicide forming metal, for example titanium, (Ti), tungsten, (W), tantalum, (Ta), cobalt, (Co), or the like, is deposited via sputtering or evaporation to a thickness of about 200 to 500 angstroms, shown in FIG. 5 as layer 17. The previous processing was performed to intentionally produce a polysilicon gate structure with the negative angle or the overhang. Thus the metal deposition results in an intention, and desired discontinous film.

Figure 6:
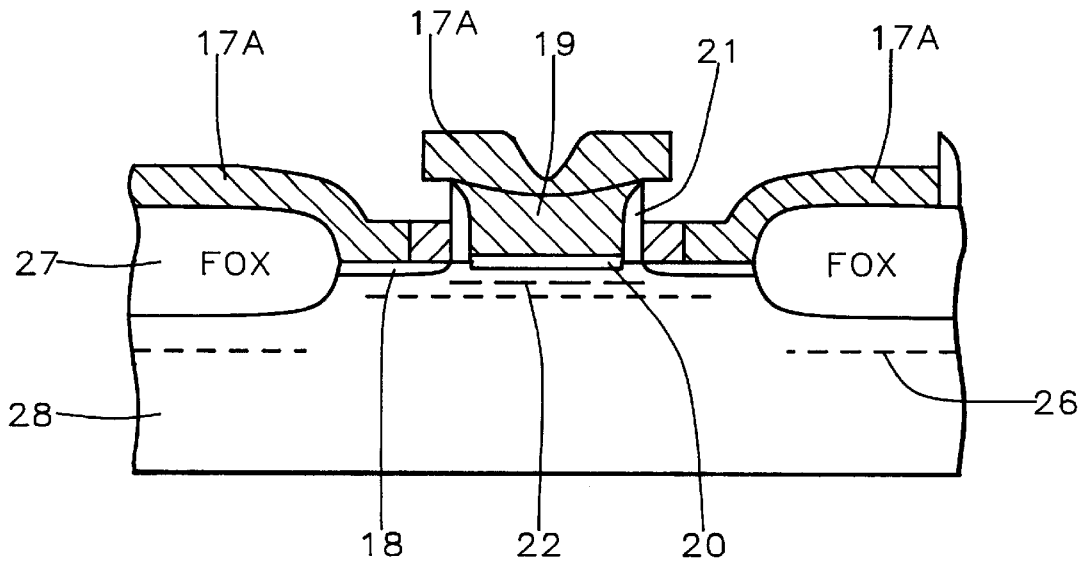

FIG. 6 shows the result of a two step silicidation process. First an anneal is performed at 600–700° C. to form a specific TiSi2 film, 17A, on areas where Ti is interfacing silicon, such as the s/d and gate polysilicon surfaces. Where Ti is on insulator, such as the spacer oxide 21 and the field oxide 27, the Ti remains unreacted. This anneal step can be accomplished using conventional furnace processing or via RTA. Next a wet chemical strip is used to selectively remove the unreacted Ti from the structure. This is accomplished using a 1:1:5 composition of NH4OH:H2O2:H2O at a temperature between about 25 to 40° C. Finally an additional anneal is performed, again in a conventional or RTA furnace at a temperature of about 800° C., using 30 to 60 sec. for the RTA process. This is performed to further reduce the resistivity of the TiSi2 film.

Figure 7:
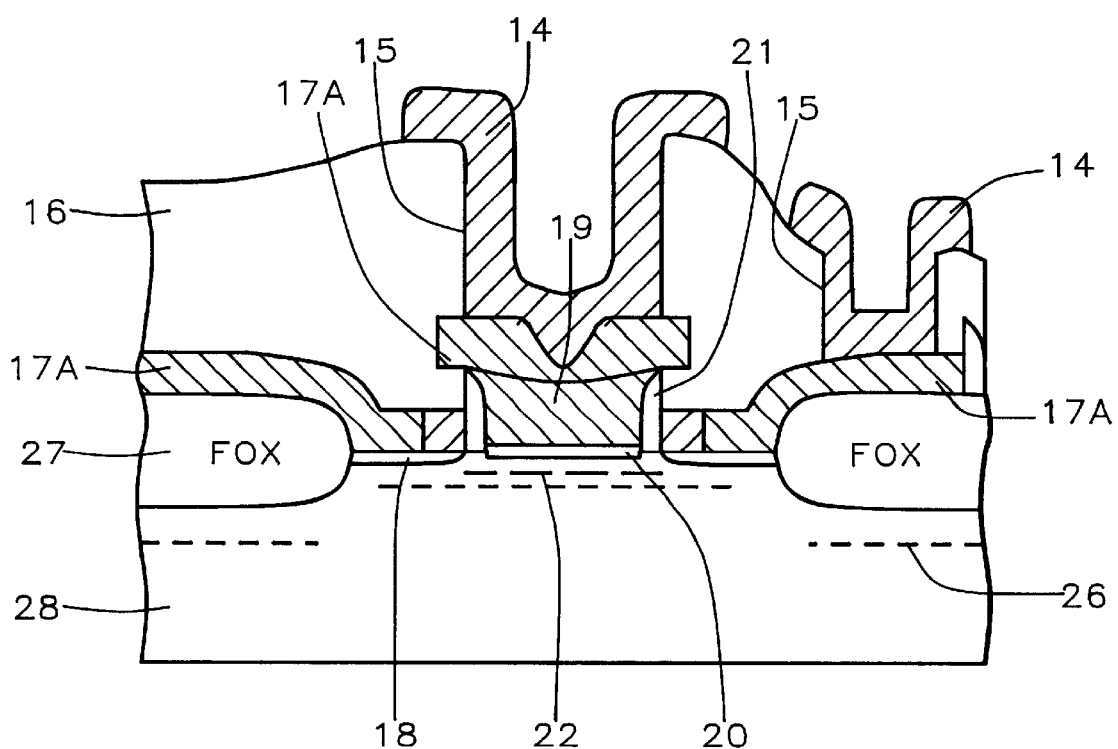

A oxide, 16, is now deposited using LPCVD at 400 to 600° C. or a lower temperature plasma enhanced process (PECVD) at 400° C., to a thickness of 6000 to 9000 angstroms. Standard photolithographic techniques are used again, along with a RIE process, using CHF3+Ar, to produce the contact holes, 15, to the polysilicon gate 19, as well as to the polysiliocn source-drain extensions 25. This is schematically shown in FIG. 7. Metal is deposited using either PECVD, LPCVD, evaporation or sputtering. The metallurgy can be Ti under alminum at a thickness of 1000 and 6000 angstroms respectively. Standard photolithographic and metal RIE processing is performed to result in metal contacts 14. The RIE processing can be accomplished using Cl2.

It should be noted that this invention, self aligned silicidation, although shown as part of a NFET device, can be used for fabrication of PFET, CMOS, or BiCMOS devices.

While this invention has been particularly shown and described with reference to the preferred embodiments thereof, it will be understood by those skilled in the art that various changes in form and details may be made without departing from the spirit and scope of this invention.

What is claimed is:

1. A MOSFET (Metal Oxide Semiconductor Field Effect Transistor) device structure, with a metal silicide-polysilicon gate structure, comprised of an overlying, metal silicide gate, overhanging a narrower, underlying polysilicon gate, comprising:

field oxide regions on the surface of a semiconductor substrate;

a first device region between said field oxide regions;

two, first polysilicon structures, each overlying a said field oxide region, and also overlying a portion of said first device region, adjacent to said field oxide regions, creating a second device region, free of said first polysilicon structures;

a gate insulator layer on said second device region;

insulator spacers located on the sides of each said first polysilicon structure;

said polysilicon gate, overlying said gate insulator layer, on said second device region, between said insulator spacers on said first polysilicon structures;

said metal silicide gate, wider in width then said polysilicon gate, overlying said polysilicon gate, overlying said insulator spacers on said first polysilicon structure, and overhanging a portion of underlying said polysilicon structures;

source and drain regions in the surface of said semiconductor substrate, underlying said first polysilicon structures; and metal contacts to said first polysilicon structures, and to said metal silicide-polysilicon gate structure.

2. The MOSFET device structure of claim 1, wherein said insulator spacer is silicon oxide.

3. The MOSFET device structure of claim 1, wherein said insulator spacer is $Si_3N_4$.

4. The MOSFET device structure of claim 1, wherein a top portion of said metal silicide-polysilicon gate structure, is titanium silicide, $TiSi_2$.

* * * * *